(12) United States Patent
Singh et al.

(10) Patent No.: US 9,218,954 B2
(45) Date of Patent: Dec. 22, 2015

(54) DEFECT CAPPING METHOD FOR REDUCED DEFECT DENSITY EPITAXIAL ARTICLES

(71) Applicant: Sinmat, Inc., Gainesville, FL (US)

(72) Inventors: Rajiv K. Singh, Newberry, FL (US); Arul Chakkaravarthi Arjunan, Gainesville, FL (US)

(73) Assignees: Sinmat, Inc., Gainesville, FL (US); University of Florida Research Foundation, Inc., Gainesville, FL (US)

( * ) Notice: Subject to any disclaimer, the term of this patent is extended or adjusted under 35 U.S.C. 154(b) by 237 days.

(21) Appl. No.: 13/872,821

(22) Filed: Apr. 29, 2013

(65) Prior Publication Data

US 2013/0237041 A1    Sep. 12, 2013

Related U.S. Application Data

(62) Division of application No. 12/723,309, filed on Mar. 12, 2010, now abandoned.

(51) Int. Cl.

| H01L 21/00 | (2006.01) |
|---|---|
| H01L 21/02 | (2006.01) |
| C30B 25/18 | (2006.01) |
| C30B 29/36 | (2006.01) |
| H01L 21/306 | (2006.01) |
| H01L 29/16 | (2006.01) |
| H01L 29/20 | (2006.01) |

(52) U.S. Cl.
CPC .......... *H01L 21/0201* (2013.01); *C30B 25/186* (2013.01); *C30B 29/36* (2013.01); *H01L 21/0237* (2013.01); *H01L 21/0254* (2013.01); *H01L 21/02378* (2013.01); *H01L 21/02389* (2013.01); *H01L 21/02439* (2013.01); *H01L 21/02458* (2013.01); *H01L 21/02521* (2013.01); *H01L 21/02529* (2013.01); *H01L 21/02639* (2013.01); *H01L 21/02647* (2013.01); *H01L 21/30608* (2013.01); *H01L 21/30617* (2013.01); *H01L 21/30625* (2013.01); *H01L 29/1608* (2013.01); *H01L 29/2003* (2013.01)

(58) Field of Classification Search
CPC ................. H01L 21/0201; H01L 21/0237
USPC ....................... 438/46–47, 77, 312
See application file for complete search history.

(56) References Cited

U.S. PATENT DOCUMENTS

| 6,165,874 | A | 12/2000 | Powell et al. |
|---|---|---|---|
| 6,784,074 | B2 | 8/2004 | Shchukin et al. |
| 2007/0259464 | A1 | 11/2007 | Bour et al. |
| 2010/0184279 | A1 | 7/2010 | Wuu et al. |

FOREIGN PATENT DOCUMENTS

WO    2008141324    11/2008

*Primary Examiner* — Samuel Gebremariam
(74) *Attorney, Agent, or Firm* — Jetter & Associates, P.A.

(57) ABSTRACT

A method for forming an epitaxial layer on a substrate surface having crystalline defect or amorphous regions and crystalline non-defect regions includes preferential polishing or etching the crystalline defect or amorphous regions relative to the crystalline non-defect regions to form a decorated substrate surface having surface recess regions. A capping layer is deposited on the decorated substrate surface to cover the crystalline non-defect regions and to at least partially fill the surface recess regions. The capping layer is patterned by removing the capping layer over the crystalline non-defect regions to form exposed non-defect regions while retaining the capping layer in at least a portion of the surface recess regions. Selective epitaxy is then used to form the epitaxial layer, wherein the capping layer in the surface recess regions restricts epitaxial growth of the epitaxial layer over the surface recess regions.

14 Claims, 4 Drawing Sheets

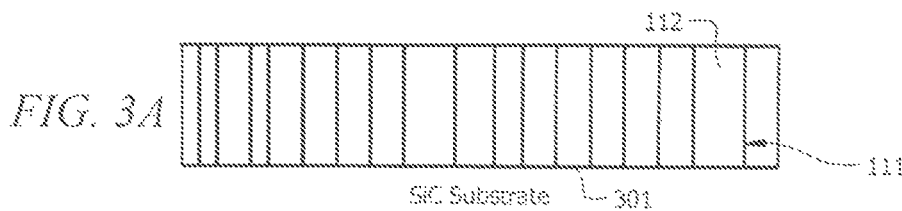
FIG. 3A  SiC Substrate
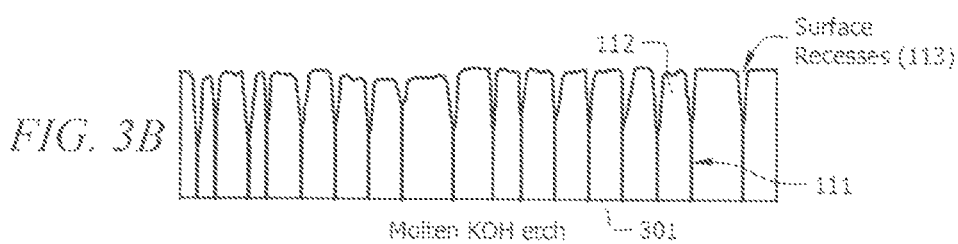
FIG. 3B  Molten KOH etch
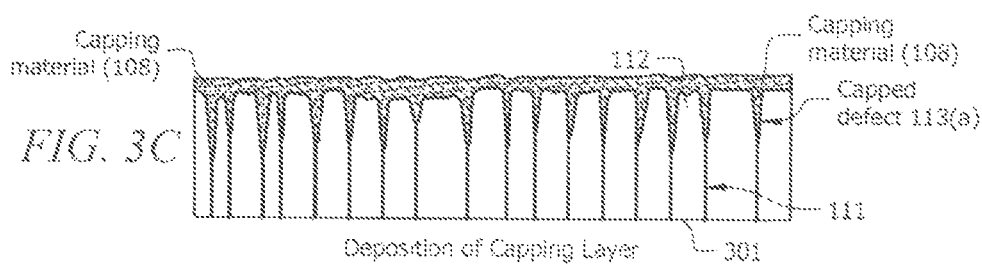
FIG. 3C  Deposition of Capping Layer
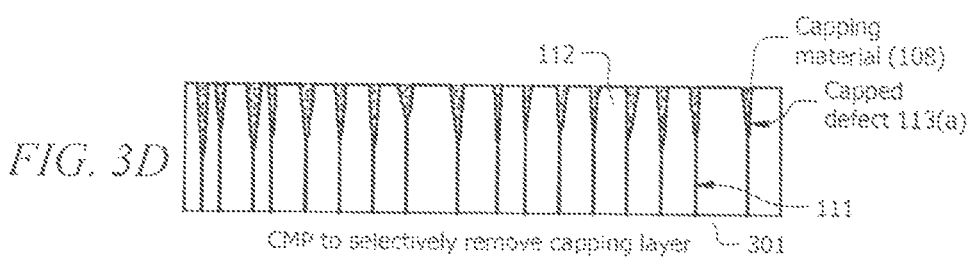
FIG. 3D  CMP to selectively remove capping layer
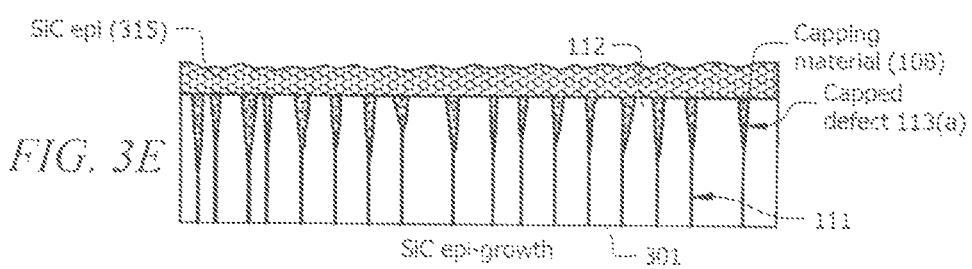
FIG. 3E  SiC epi-growth
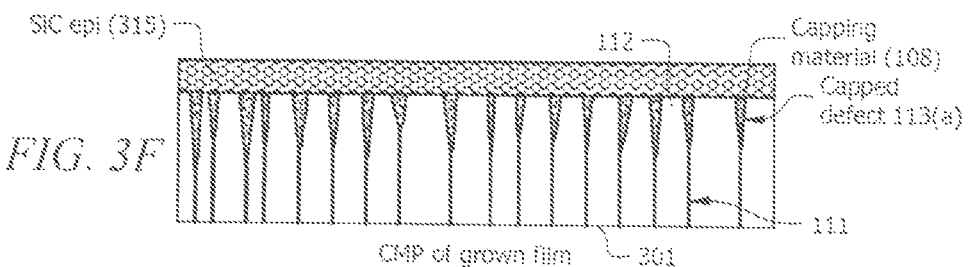
FIG. 3F  CMP of grown film

US 9,218,954 B2

DEFECT CAPPING METHOD FOR REDUCED DEFECT DENSITY EPITAXIAL ARTICLES

CROSS-REFERENCE TO RELATED APPLICATIONS

This application is a divisional application of U.S. Non-Provisional patent application Ser. No. 12/723,309 filed Mar. 12, 2010, entitled "DEFECT CAPPING FOR REDUCED DEFECT DENSITY EPITAXIAL ARTICLES".

FIELD

Disclosed embodiments relate to methods for forming reduced defect density epitaxial layers on substrates, and epitaxial articles therefrom.

BACKGROUND

Epitaxial layers are used in a wide variety of devices, including semiconductor devices. In a significant percentage of these devices, a low defect density epitaxial layer is needed for proper device operation. An epitaxial layer is defined as a film that is grown on a substrate having a substrate surface which acts as a seed crystal, wherein the deposited epitaxial film takes on a lattice structure and orientation based on that of the substrate surface.

Crystalline defects are known to include one dimensional, two dimensional and three dimensional defects, which are referred to as propagating defects during epitaxial growth since they propagate in epitaxial layers during epitaxial growth. Such crystalline defects can adversely affect the performance of the device. One-dimensional defects include straight dislocations (edge or screw), dislocation loops, two dimensional defects include grain boundaries stacking faults, & twins, while three dimensional defects include precipitates & voids. In the case of semiconductor devices, during their operation propagating defects can act as scattering centers for carriers, thus reducing carrier mobility which limits the performance (e.g., speed) of the semiconductor device. Propagating defects can also act as centers of non-radiative recombination, affecting performance of light-emitting devices such as light emitting diodes (LED), optical amplifiers, and semiconductor diode lasers. Propagating devices can multiply or transform to other form of defects during device operation and can kill the device or degrade the performance of device (e.g., current collapse or increase reverse leakage current).

Regarding semiconductor integrated circuits (ICs) or semiconductor power devices, wide band gap semiconductors such as gallium nitride (GaN), aluminum nitride, indium nitride and silicon carbide (SiC) along with diamond are sometimes referred as "final frontiers for semiconductors". For example, group III-nitride semiconductors such as GaN have capabilities including amplifying (with low distortion) high-frequency RF signals, and high temperature operability, and are thus ideally suited for a wide range of applications. GaN is generally grown as an epitaxial layer on a substrate material, such as GaN, SiC, sapphire or Si. One of the most important challenges for rapid development of GaN based RF devices is the ability to control the defect density during GaN epitaxial film growth.

As known in the art, high densities of defects are generally present on the growth template substrates that propagate during GaN film growth process. Although several GaN film growth techniques, such as epitaxial lateral overgrowth (ELOG) process have been developed, the defect density in at least portions of the GaN layer is still very high compared to conventional silicon substrates. Although processes such as ELOG in which the substrate is covered with a patterned SiN or $SiO_2$ masking layer and then selective epitaxial growth occurs from exposed areas on the substrate can significantly reduce the defect density locally, such selective growth processes create regions of varying microstructural quality across the area of the wafer (e.g., high/low defectivity regions) which hinders scalable development of GaN-based devices. There is thus a need to develop new methods and epitaxial articles therefrom that have high quality (i.e. low defect density) across the full area of the epitaxial layer, such as across the full area of the wafer.

SUMMARY

Embodiments of the invention describe methods for forming reduced defect density epitaxial layers on a substrate, and epitaxial articles therefrom. The reduced defect density epitaxial layers generally extend across the entire area of the epitaxial layer to provide a uniform microstructure. The epitaxy can be either homoepitaxy (i.e., epitaxial layer having the same composition as the substrate surface) or heteroepitaxy (i.e., epitaxial layer having a different composition as compared to the substrate surface).

A method for forming an epitaxial layer on a substrate surface having crystalline defect or amorphous regions and crystalline non-defect regions includes preferential polishing or etching the crystalline defect or amorphous regions relative to the crystalline non-defect regions to form a decorated substrate surface having surface recess regions. A capping layer is deposited on the decorated substrate surface to cover the crystalline non-defect regions and to at least partially fill the surface recess regions. The capping layer is patterned by removing the capping layer over the crystalline non-defect regions to form exposed non-defect regions while retaining the capping layer in at least a portion of the surface recess regions. Selective epitaxy is then used to form the epitaxial layer, wherein the capping layer in the surface recess regions restricts epitaxial growth of the epitaxial layer over the surface recess regions.

BRIEF DESCRIPTION OF THE DRAWINGS

FIGS. 3A-F show successive cross sectional depictions for an exemplary DCAP process flow for forming a reduced defect density epitaxial layer on a substrate shown as a SiC epitaxial layer on a bulk SiC substrate, according to an embodiment of the invention.

DETAILED DESCRIPTION

Figure 1:
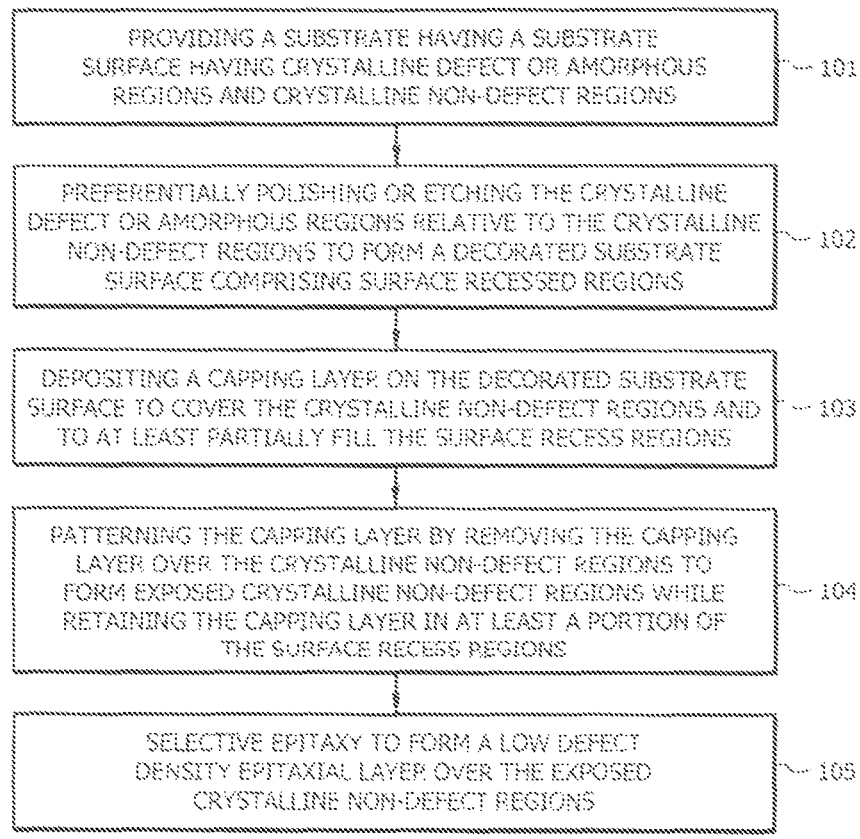
FIG. 1 shows steps in an exemplary defect capping (DCAP) method for forming reduced defect density epitaxial layers on crystalline substrate surfaces, according to an embodiment of the invention.

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the disclosed embodiments can be practiced without one or more of the specific details or with other methods. In other instances, well-known structures or operations are not shown in detail to avoid obscuring the disclosed embodiments. The disclosed embodiments are not limited by the illustrated ordering of acts or events, as some acts may occur in different orders and/or concurrently with other acts or events. Furthermore, not all illustrated acts or events are required to implement a methodology in accordance with disclosed embodiments.

Disclosed embodiments include methods for forming reduced defect density epitaxial layers and epitaxial articles therefrom. Methodologies included delineating surface crystalline defects in the substrate surface and capping the delineated defects present in the substrate surface so that nucleation from the defect regions during subsequent epitaxial growth is generally prevented, or is at least restricted. Defect delineation can also remove stressed regions, round the defects, and provide strain flexibility to reduce growth stresses in the epitaxial layer formed on the defect capped substrate. The growth stresses are believed to be reduced primarily because the defect delineated regions have ability to move laterally so that stresses are relaxed. Based on disclosed embodiments, since the defect density of the epitaxial layer grown is no longer significantly dependent on the substrate quality (e.g., its defect density) from the as received substrate from the substrate suppliers/vendors, lower cost bulk substrates (e.g., bulk silicon wafers) can generally be used, which can significantly reduce manufacturing costs.

Disclosed embodiments are widely applicable to a variety of materials and as described above apply to both homoepitaxy and heteroepitaxy. Exemplary materials for use as substrate or epitaxial layers include, but are not limited to, Group IV, Group II-VI, Group III-V and Group IV-VI materials.

Non-limiting examples of homoepitaxy include silicon on silicon, GaN on GaN, SiC on SiC, and GaAs on GaAs. Non-limiting examples of heteroepitaxy include SiGe on Si, GaN on sapphire, aluminum gallium indium phosphide (AlGaInP) on gallium arsenide (GaAs), and $Ga_xIn_yAl_zN$ on GaN, where x,y,z can vary from 0 to 1.0 and typically x+y+z=1.0.

The Group IV materials can comprise Group IV elemental semiconductors such as Diamond (C), Silicon (Si), Germanium (Ge). The Group IV materials can also comprise Group IV compound semiconductors such as SiC, Silicon-germanium (SiGe) or Si—Ge—C.

The Group II-VI materials can comprise II-VI semiconductors such as Cadmium selenide (CdSe), Cadmium sulfide (CdS), Cadmium telluride (CdTe), Zinc oxide (ZnO), Zinc selenide (ZnSe), Zinc sulfide (ZnS), Zinc telluride (ZnTe) and II-VI ternary alloy semiconductors including Cadmium zinc telluride (CdZnTe, CZT), Mercury cadmium telluride (HgCdTe), Mercury zinc telluride (HgZnTe), Mercury zinc selenide (HgZnSe)).

The Group III-V materials can comprise III-V semiconductors including Aluminum antimonide (AlSb), Aluminium arsenide (AlAs), Aluminium nitride (AlN), Aluminium phosphide (AlP), Boron nitride (BN), Boron phosphide (BP), Boron arsenide (BAs), Gallium antimonide (GaSb), GaAs, GaN, Gallium phosphide (GaP), Indium antimonide (InSb), Indium arsenide (InAs), Indium nitride (InN), Indium phosphide (InP) and III-V ternary semiconductor alloys including Aluminium gallium arsenide (AlGaAs, $Al_xGa_{1-x}As$), Indium gallium arsenide (InGaAs, $In_xGa_{1-x}As$), Indium gallium phosphide (InGaP), Aluminium indium arsenide (AlInAs), Aluminium indium antimonide (AlInSb), Gallium arsenide nitride (GaAsN), Gallium arsenide phosphide (GaAsP), Aluminium gallium nitride (AlGaN), Aluminium gallium phosphide (AlGaP), Indium gallium nitride (InGaN), Indium arsenide antimonide (InAsSb), Indium gallium antimonide (InGaSb), III-V quaternary semiconductor alloys including Aluminium gallium indium phosphide (AlGaInP, also InAlGaP, InGaAlP, AlInGaP), Aluminium gallium arsenide phosphide (AlGaAsP), Indium gallium arsenide phosphide (InGaAsP), Aluminium indium arsenide phosphide (AlInAsP), Aluminium gallium arsenide nitride (AlGaAsN), Indium gallium arsenide nitride (InGaAsN), Indium aluminum arsenide nitride (InAlAsN), Gallium arsenide antimonide nitride (GaAsSbN) and III-V quinary semiconductor alloys including Gallium indium nitride arsenide antimonide (GaInNAsSb), Gallium indium arsenide antimonide phosphide (GaInAsSbP).

The Group IV-VI materials can comprise IV-VI semiconductors including Lead selenide (PbSe), Lead sulfide (PbS), Lead telluride (PbTe), Tin sulfide (SnS), Tin telluride (SnTe) and IV-VI ternary semiconductors including lead tin telluride (PbSnTe), Thallium tin telluride ($Tl_2SnTe_5$), Thallium germanium telluride ($Tl_2GeTe_5$)). Alloys of the materials described above are also all generally included.

Referring now to FIG. 1, a DCAP method 100 for forming reduced defect density epitaxial layers on crystalline substrate surfaces according to an embodiment of the invention is shown. In step 101, a substrate is provided comprising a surface having crystalline defect or amorphous regions and crystalline non-defect regions. The substrate can be a bulk substrate, an epitaxial substrate or a coated substrate. A bulk substrate refers to substrate of similar composition throughout with thickness at least 50 micrometers. A coated substrate is bulk substrate coated with film thickness ranging from 5 Å to 1 mm. The films can comprise single or multiple layers. An epitaxial substrate can be a bulk substrate with a epitaxial film thereon generally having a thickness of 5 Angstroms to 1 millimeters, such as grown over a commercially provided substrate. The epitaxial substrate can comprise single or multiple layers. Epitaxial substrates can also comprise a bulk substrate with one or more coated layers followed by epitaxial layers.

The underlying layer/layers may have an epitaxial or non-epitaxial orientation. To distinguish the epitaxial layers in disclosed embodiments where the reduced defect density epitaxial layer is grown over an substrate that typically includes a thin epitaxial layer thereon, references to the "epitaxial layer" herein will generally refer to the reduced defect density epitaxial layer described in detail herein, while the underlying layer provided by an epitaxial substrate will generally be referred to herein as an "underlying epitaxial layer".

As described above, the substrate and underlying epitaxial layer (if present) can be independently selected from group IV, II-VI, III-V, IV-VI materials, or binary ternary or quaternary alloys of group VI, II-VI and III-V materials or other materials which have an epitaxial relation relationship for forming epitaxial layer or thin underlying epitaxial layers such as those described above. For example, in a particular embodiment the substrate comprises silicon, SiC or SiGe, GaAs, GaP or Ge, diamond, sapphire, zinc oxide, III-Nitrides such as AlGaN, AlN, InN, or GaN, and the underlying epitaxial layer can comprise a group III-nitride semiconductor, such as AlGaN, AlN, InN, GaN, or a Group II-VI compound or a Group IV material. In other particular embodiments, the substrate comprises SiC and the underlying epitaxial layer comprises SiC. In yet another particular embodiment, the substrate comprises diamond.

In step 102, the crystalline defect or amorphous regions in the substrate surface are preferentially polished or etched relative to the crystalline non-defect regions to form a decorated substrate surface comprising surface recessed or dimpled regions, thus delineating defects. In one embodiment, the preferential polishing or etching comprises wet chemical etching. In another embodiment, the preferential polishing or etching comprises dry chemical etching, such plasma etching or reactive ion etching (RIE). Other preferential chemical etching processes can include Inductively Coupled Plasma (ICP) etching and chemically assisted ion beam etching. In yet another embodiment, the preferential polishing or etching comprises chemical mechanical polishing (CMP).

CMP involves moving the substrate relative to a polymeric pad which is supplied with a slurry. The slurry is a mixture of chemicals and particles. The particles are typically oxides of silicon, aluminum, zirconium or carbides or nitrides of silicon, boron, tantalum or diamond. The chemicals typically comprise surfactants, oxidizers and pH control additives. The typical pH ranges from 0.5 to 13.5 and oxidizing agents such as $H_2O_2$, oxones, ferricynates, per-compounds such as perchlorates, and permanganates are added. The surfactants can be anionic, cationic or non ionic surfactants. Salts such as halides, sulfates, nitrates, can be used. Typical polishing pressure can range from 0.1 to 20 psi, while the particle content can vary from 0.0 to 50%. The particle size can generally vary from 2 nm to 100 micron.

The CMP process can be designed to remove material uniformly in the crystalline defect or amorphous regions and crystalline non-defect areas. The CMP processes for delineating defects and will generally have high removal rates at defect or amorphous sites when compared to crystalline non-defect areas to generate surface recessed regions. This is because defect or amorphous areas can be more reactive with CMP slurry chemistry or may be softer for easier mechanical removal. The polishing selectivity between defective regions and non-defective regions allows delineation of defects. The selectivity ratio can be defined as the ratio of the polishing rate in non-defect regions and defect regions. Under the same polishing conditions this ratio should range from 0.0 to 0.999 for defect delineation. The polish rate for each of the regions can vary from 1 A/hr up to 10 mm/hr. It is desirable to have a low polish rate ratio since it generally becomes easier to delineate the defects. The polishing selectivity ratio can be below 0.98, such as below 0.90.

The CMP process for delineating defects will thus generally have high chemical or mechanical action for the defective regions as compared to non defective regions. In the case of defect delineating CMP, crystalline non-defect regions experience low polishing rates relative to crystalline defect regions. The non-defect regions after defect delineating CMP are generally highly planar with low surface roughness generally being atomic scale roughness, which is defined herein as <5 A rms roughness. The recessed area can vary for less than 50% of the total area of the substrate to as low as 0.0001% of the total area of the substrate. The depth of recessed area can vary for 5 Å up to 100 μm. The area of the each recessed area can vary from $0.1\mu^2$ to $10,000\mu^2$. The number of recessed structures can vary from $1/cm^2$ to $10^{14}/cm^2$ depending on the defect density of the material.

Steps 103 and 104 described below in combination are essentially analogous to a damascene process (e.g., copper damascene) which together function to cap defects in that they involve a process to fill up apertures that comprise surface recess regions followed by removal of the overburden deposited material. Step 103 comprises depositing a capping layer on the decorated substrate surface to cover the crystalline non-defect regions and to at least partially (and generally fully fill) the surface recess regions. The capping layer material generally comprises an amorphous or polycrystalline material that is compositionally different from the substrate surface composition. The deposition of the capping layer generally comprises a blanket (un-masked) deposition, and the capping layer after subsequent patterning described below provides a masking function for restricting growth of the epitaxial layer over the surface recess regions.

The typical thickness of the applied capping layer can match the surface recess regions depth, or it can be less or equal or more (5 A to 100 microns) as compared to the depth of the surface recess regions. The capping layer generally comprises a blanket (i.e., unmasked) deposition, such as provided by CVD, LPCVD or PECVD processing, PVD, spin coating or generally any other physical, chemical, or electrochemical or electroless deposition method. In a typical process, the blanket capping layer fills the surface recess regions and extends above the surface recess regions and is also deposited laterally thereto, which is then etched back or polished to define the capping layer and remove the capping layer in the overburden regions.

The capping layer can be defined as a layer from which the epitaxial film growth rate is at least 20% to 100% lower (100% lower which is equivalent to no growth) as compared to the growth rate over non-capped surface regions in which the non-defect regions are exposed. As described above, in one embodiment the reduced defect density epitaxial film does not nucleate from the defect capped regions. The capping layer can comprise, for example, silica, silicon nitride or silicon oxynitride, metals, non-metals, ceramics, photo-resists, crystalline or amorphous materials. The capping layer can also comprise a metal or metal alloy (e.g., by electrochemical or electroless deposition) such as comprising a refractory metal, polymer, ceramic, composite, glass, or generally any combination thereof.

Step 104 comprises patterning the capping layer by removing the capping layer over the crystalline non-defect regions to form exposed non-defect regions while retaining the capping layer within at least a portion of the surface recess regions. In one embodiment, the patterning comprises CMP. CMP removes the overlay of capped material (overburden) from non-defective regions and leaves the capping material inside within the surface recess regions. The CMP of the capping layer can also be carried out under wide variety of conditions. The process can generally use any polymeric pad, with polishing pressure ranging from 0.1 to 20 psi. The slurry composition can be varied as described above in the section on defect delineation. The polish rate of the CMP can vary from 0.01 Å/min to 10 μm/min. In another embodiment, the patterning comprises dry chemical etching, such as RIE or chemical etching.

Step 105 comprises selective epitaxy to form a reduced defect density epitaxial layer over the exposed crystalline non-defect regions, wherein the capping layer in the surface recess regions restricts, and generally prevents, nucleation during growth of the epitaxial layer over the surface recess regions. The formation of the reduced defect density layer or epigrowth can be vertical growth or lateral growth, or combination of both and thereof. As the growth is taking place from non-defective areas, reduced epitaxial growth from such surfaces is generally provided.

Optionally, method 100 can include CMP of the decorated substrate surface to provide an atomic scale finish, defined herein as being <5 A rms surface roughness before the depositing step (step 103). Another optional step comprises planarizing the epitaxial layer after step 105 using a process comprising CMP.

Figure 2A:
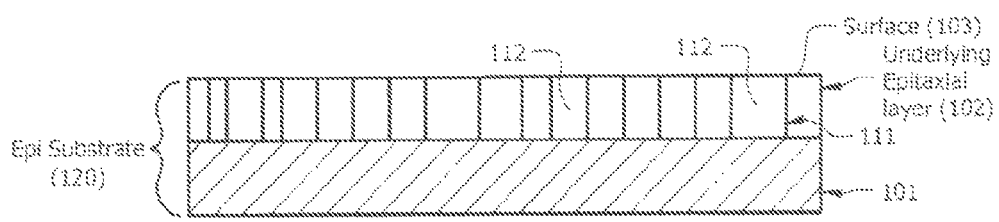
FIGS. 2A-F show successive cross sectional depictions for an exemplary DCAP process flow for forming a reduced defect density epitaxial layer on a substrate shown as GaN epitaxial layer on an epi substrate having a thin GaN layer thereon, according to an embodiment of the invention.
Figure 2B:
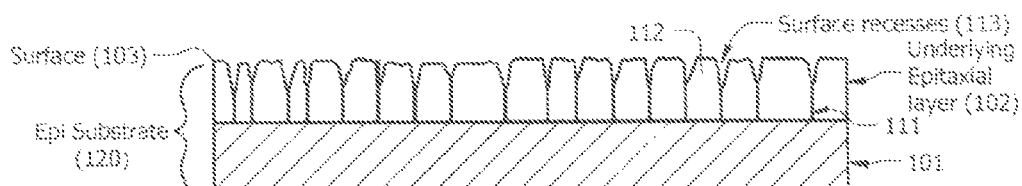
Figure 2C:
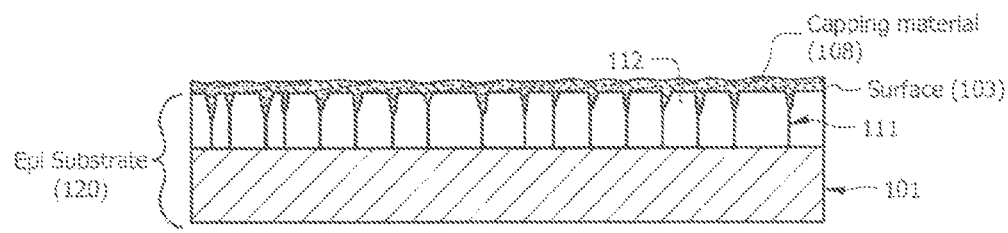
Figure 2D:
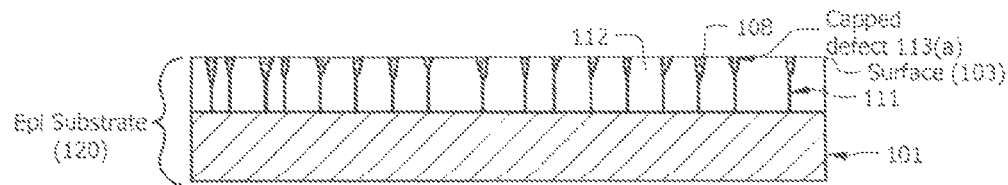
Figure 2E:
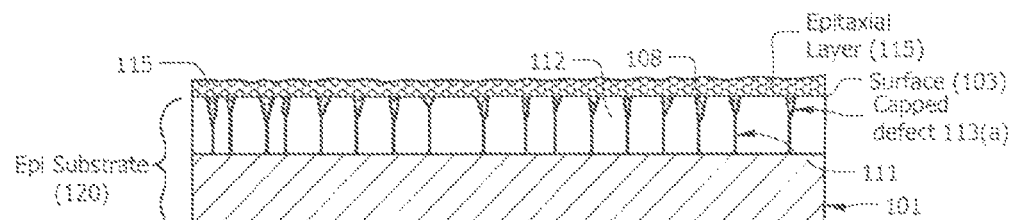

FIGS. 2A-F show successive cross sectional depictions for an exemplary DCAP homoepitaxy process flow for forming a reduced defect density epitaxial layer on a substrate shown as GaN epitaxial layer 115 on an epi substrate 120 comprising a thin GaN underlying epitaxial layer 102 on a base substrate layer 101, according to an embodiment of the invention. As shown in FIG. 2A, the thin GaN underlying epitaxial layer 102 includes a top surface 103 and includes crystalline defect or amorphous regions 111 shown as dislocations and crystalline non-defect regions 112. The dislocations 111 are shown extending the full thickness of the GaN underlying epitaxial layer 102, but can extend over only a portion of the thickness. FIG. 2B shows a cross sectional depiction following preferential polishing or etching which decorates the surface 103 of the GaN underlying epitaxial layer 102 by delineating defects to form the surface recess regions 113 shown. FIG. 2C shows a cross sectional depiction following deposition of a capping layer material 108 which is shown filling the surface recess regions 113. FIG. 2D shows a cross sectional depiction following patterning of the capping layer 108, such as by CMP processing to form capped defects 113(a). FIG. 2E shows a cross sectional depiction following selective epitaxy to form an epitaxial layer 115, such as an epitaxial GaN layer, over the surface 103 of the thin GaN underlying epitaxial layer 102. Lateral growth of epitaxial layer 115 during epitaxy allows epitaxial layer 115 to form over capped defects 113(a) without growing therefrom.

Figure 2F:
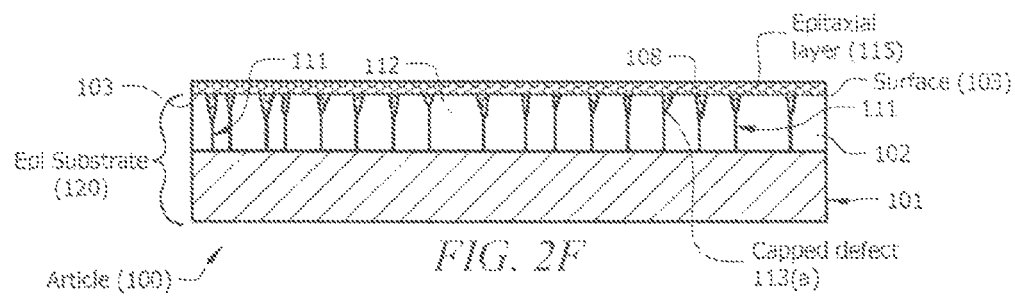

FIG. 2F shows the epitaxial article 100 following CMP of the surface of the reduced defect density epitaxial layer 115 to provide an atomically smooth finish (i.e., <5 A rms surface roughness). Article 100 is shown including base substrate 101, thin GaN underlying epitaxial layer 102 thereon that provides a substrate surface 103 for epitaxy. Underlying epitaxial layer 102 is shown including crystalline defect regions 111 shown as dislocations and crystalline non-defect regions 112. The defect regions 111 are recessed from the substrate surface 103 by what had been surface recess regions 113 described above that are filled with a capping material 108, such as silicon oxide, silicon oxynitride, silicon nitride, or other amorphous or polycrystalline materials, and shown as capped defects 113(a).

The capping material 108 in capped defects 113(a) extends from a top of the defect regions 111 (bottom of what had been surface recess regions 113) to the surface 103 of the GaN underlying epitaxial layer 102. The capping material 108 is compositionally different from the composition of the surface 103 of the GaN underlying epitaxial layer 102 in the non-defect regions. The epitaxial layer 115 over the surface 103 of the GaN underlying epitaxial layer 102 provides an average crystalline defect density in at least one area having a size $\geq 0.1\mu^2$ that is $\geq$ two times lower than an average crystalline defect density in that area at or below the surface 103 of the GaN underlying epitaxial layer 102. In a typical embodiment, the area of the reduced defect density epitaxial layer 115 is across an entire wafer (except the wafer edge, such as the edge exclusion region of the wafer).

In a typical embodiment, the average crystalline defect density throughout the epitaxial layer 115 is $\leq 10^8$ cm$^{-2}$, such as $\leq 10^6$ cm$^{-2}$, which is generally at least two times lower, such as one to five orders of magnitude lower, than an average crystalline defect density in the area at or below the substrate surface (homoepitaxy) or the surface of the underlying epitaxial layer (heteroepitaxy). The epitaxial layer 115 also generally has a uniform microstructure over its entire area. Uniform microstructure is defined herein as the defect density (measured by etch pit density) of epitaxial layer 115 over the full area of the wafer (other than the edge exclusion region) being $\leq 10^9$ cm$^{-2}$. The uniform microstructure provided by epitaxial layers described herein can be compared to the non-uniform microstructure of ELOG generated epitaxial layers described in the Background above that comprises regions of varying microstructural quality across the area of the wafer (i.e. laterally alternating high/low defectivity regions). For ELOG generated epitaxial layers, the high defectivity regions have a defect density $\geq 10^{12}$ cm$^{-2}$ that is generally at least 4 orders of magnitude higher as compared to the defect density in the low defectivity region.

FIGS. 3A-F show successive cross sectional depictions for an exemplary DCAP process flow including exemplary process steps for forming a reduced defect density SiC epitaxial layer 315 on a bulk SiC substrate 301, according to an embodiment of the invention. FIGS. 3A-F closely follow the sequence described above for FIGS. 2A-F. The crystalline defects 111 are shown as dislocations that are delineated using a molten KOH etch. The formation of a reduced defect density SiC epitaxial 315 layer can be through vertical growth or lateral growth, or by a combination of both vertical and lateral growth. FIG. 3F shows an epitaxial SiC on SiC article, wherein the surface of the reduced defect density SiC epitaxial 315 layer has an atomically smooth finish, such as following CMP of the structure depicted in FIG. 3E.

Disclosed embodiments can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, and devices such as light emitting elements, diodes, or transistors. Moreover, embodiments of the invention can be used in a variety of processes including bipolar, CMOS, BiCMOS and MEMS.

EXAMPLES

Disclosed embodiments are further illustrated by the following specific examples, which should not be construed as limiting the scope or content of the disclosed embodiments in any way.

Example 1

GaN Epitaxy on GaN Substrates (Homoepitaxy on Underlying Layer)

GaN wafers can be obtained from several different vendors. The preferential etching or polishing process selectively etches the crystalline defect regions on the GaN wafers (step 102). The etching also reduces the stress in the GaN substrate and also in the epitaxial film to be grown thereon. GaN wafers can be etched using standard wet chemical techniques involving the use of solutions such as hot phosphoric acid or hydroxides including a KOH solution. The effect of substrate temperature and the etching time for the process can be determined by routine experimentation. The depth of the surface recessed or dimpled regions (etching pits) and its dimensions will generally depend on both process conditions (e.g., etching time and temperature) and the nature of the defects (e.g., dislocations). Wet chemical etching may lead to roughening of the non-defect regions of the wafer. The etch depth groove area/volume can be controlled by controlling the etching concentration, the temperature and/or the etch time.

Added surface roughness if generated by the wet chemical etching can be substantially eliminated by a subsequent CMP process. For example, CMP can be performed on the preferentially etched substrate having a decorated substrate surface to achieve an atomic scale finish. LPCVD or PECVD can be used to deposit a capping layer. As noted above, the capping layer can comprise materials such as silica and silicon nitride. A capping layer CMP process can then follow to selectively remove the capping layer overburden (i.e. removing the capping layer over the non-defect regions to form exposed non-defect regions).

The recessed structure can also be made by CMP processing using silica based slurries. The pH of the slurries can generally be between 0.1 to 13.5. The particle content can vary from 0.0001% to 50% weight. The polish rate can vary from 2 Å/hr to 5 µm/hr. Other particle such as γ-alumina or other oxides can also generally be used. The particles should typically have a hardness that is less than that of the substrate. The polish selectivity ratio can generally be varied from less than 0.999 using a silica based process.

Special polishing pads (IC 1000 polishing pads manufactured by Rodel, Rodel, Inc., Phoenix, Ariz.) can be used for the CMP processing. A relatively hard polishing pad ensures better surface planarity because it does not contort significantly on the wafer surface. Other examples of polishing pads that can be used include POLITEX pads from Rohm & Hass, D-100 pads from Cabot Microelectronics. Polymeric pads of various hardness (Shore D hardness 5 or higher) can also be used.

Silica comprising slurries under acidic or basic pH (0.1 to 13.5) can be used to ensure the formation of the surface ledges/terraces during the GaN polishing process. Ledges or terraces can be defined as atomic bilayer steps structures formed during crystal growth or dissolution process according to terrace-ledge-kink model. For polishing the capping layer, such as silica or silicon nitride, an alkaline slurry (pH 7.1 to 14) can also be used.

The polishing induced damage, atomic scale morphology of the surface and the cleanliness can be determined using several methods including AFM, XPS and TOF-SIMS measurements. AFM measurements can be used to determine the rms surface roughness and the presence of single atomic steps in the GaN surface. XPS measurements can be used to determine the nature of the surface modification (surface layer Ga—O—formation) of GaN. TOF-SIMS can be used to determine the presence of contamination layers/film on the GaN surface. TEM and double crystal XRD measurements can be conducted to determine any sub-surface damage.

Single crystal GaN comprising films can be grown using a variety of techniques, such as molecular beam epitaxy (MBE) and metal-organic chemical vapor deposition (MOCVD) system or HVPE (hydride vapor phase epitaxial). These techniques provide a wide range of abilities that are currently being used by industry to produce device quality material for the compound semiconductor industry. The GaN epitaxial layer film thickness can be 0.1 to 100 µm, such as approximately 2 to 4 µm in a particular embodiment.

As described above, the epitaxial layers can be polished (e.g., CMP) to reduce surface roughness. CMP can ensure that the grown epitaxial GaN films will have an atomically smooth surface finish with surface roughness less than 5 Å rms, such as measured by AFM over less than an area 5 µm×5 µm.

The use of different slurry chemistries to produce substantially scratch-free GaN surfaces with formation of atomic terraces can be used. By increasing the surface reaction with specific chemistries has been found by the inventors to enhance the formation of terraces described above. In principle, chemistries which increase chemical reactivity will also enhance the ability to form terraced structures on the surface.

Example 2

SiC Epitaxy on SiC Substrates (Homoepitaxy on Substrate; Analogous to FIGS. 3A-F Described Above)

SiC substrates can be obtained from several different vendors. The SiC substrates (e.g., 1 cm×1 cm) can be preferentially etched using standard wet chemical techniques, such as a molten KOH solution. This etch will preferentially etch the defect regions on the SiC wafer surface. The density of the recessed or dimpled regions (i.e. etching pits) can be determined by the density of the defects in the wafer. Furthermore, the depth of etching pits and its dimensions will generally depend on both process conditions (etching time and temperature) and nature of defect (e.g., dislocations). The etch depth groove area/volume can be controlled by etching concentration, temperature and time. As described above, any surface roughness following the preferential etching can be substantially eliminated by a CMP process to achieve atomic scale finish, as well as to remove overetching to reduce pit depth.

A capping layer deposition (e.g., evaporation or sputtering; PVD, LPCVD or PECVD) followed by CMP can be used for defect capping. The capping layer can comprise carbon, TaC or any other material that can be used as the capping layer depending on the temperature of the growth process and growth technique (chemical vapor transport or high temperature chemical vapor transport used for growth). As described above, following capping layer deposition, the capping layer generally polished using CMP to remove it from the non-defect regions of the substrate surface. The polishing can ensure (a) a minimum of defects the previously defect-free regions, and (b) planarization of masked defective regions.

Analogous to GaN processing described above, special hard polishing pads (IC 1000 pads manufactured by Rodel Shore D hardness greater than 5) can be used for the CMP process. Silica slurries under acidic or basic pH as described above can be used to ensure the formation of the surface ledges during the SiC polishing process. For capping layer polishing, an alkaline slurry or acidic slurry can also be used depending on the capping layer material. The polishing induced damage, atomic scale morphology of the surface and the cleanliness can be determined using several methods including AFM, XPS and TOF-SIMS measurements. AFM measurements can be can be used to determine the rms surface roughness and the presence of atomic bilayer steps in the SiC surface. XPS measurements can determine the nature of the surface modification (surface layer Si—O— formation) of SiC. TOF-SIMS can determine the presence of contamination layers/film on the SiC surface. TEM and double crystal XRD measurements can be used to determine any sub-surface damage in the wafers.

SiC epitaxial layers can be grown using several techniques, including chemical vapor deposition, high-temperature chemical vapor deposition or physical vapor transport. These three techniques provide a wide range of abilities that are currently being used by industry to produce device quality material for the compound semiconductor industry. The SiC film thickness will generally be in the range of approximately 0.01 to 100 μm, but can be higher or lower than this range. The epitaxial film can be evaluated by standard material characterization techniques such as KOH etch test, TEM, SEM and X-ray diffraction.

As described above, the SiC epitaxial layer can be polished (e.g., CMP) to reduce surface roughness. This process will generally ensure that the grown epitaxial SiC films have an atomically smooth surface finish.

Similarly the process can be used to form low defect homo epitaxial films of generally all crystalline materials particularly, elemental semiconductor group IV, II-VI, III-V and IV-VI semiconductors, and their alloys thereof (examples include Si on Si or Ge on Ge or SiGe or SiGe, GaN on GaN, AlN on AlN, AlGaN on AlGaN, InN on InN, InGaN or InGaN, InAlGaN on In AlGaN, HgCdTe/Cd and thereof).

Example 3

GaN Epitaxy on SiC Substrates (Hetero-Epitaxy Example)

FIGS. 4A-H shows successive cross sectional depictions for an exemplary DCAP process flow including exemplary process steps for forming a low defect density GaN epitaxial layer 415 on a SiC substrate 401, according to another embodiment. of the invention. SiC substrates are obtainable from several different vendors, but generally include a high include high defect densities, including defects including edge, screw, mixed or gross structural defects (e.g., micropipes, superscrew dislocations, planar defects (triangular or polygonal) comets, stacking faults, twins, inversion domain boundaries and inclusions). The crystalline defect regions 111 shown as dislocations in FIGS. 4A-H for the SiC substrate 401 (e.g., 1 cm×1 cm) can be preferentially etched using standard wet chemical techniques, such as molten KOH solution to provide the cross section depiction having surface recesses 113 shown in FIG. 4B. This etch will preferentially etch the defect regions 111 on the SiC wafer surface to form surface recess regions 113.

Figure 4A:
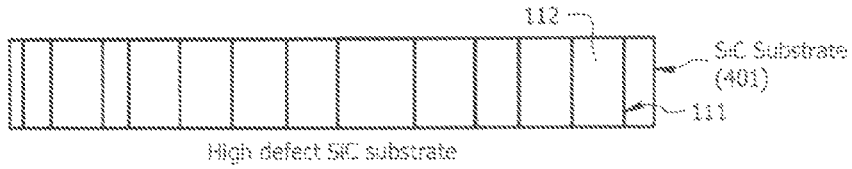
FIGS. 4A-H show successive cross sectional depictions for an exemplary DCAP process flow for forming a reduced defect density GaN or AlGaN epitaxial layer on a SiC substrate, according to another embodiment of the invention.
Figure 4B:
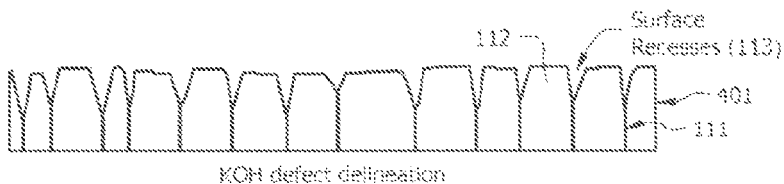
Figure 4C:

The density of the surface recessed or dimpled regions (i.e. etching pits) can be determined by the density of the defects in the wafer. Furthermore, the depth of etching pits and its dimensions will generally depend on both process conditions (etching time and temperature) and nature of defect (e.g., dislocations). The etch depth groove area/volume can be controlled by etching concentration, temperature and time. As described above, any surface roughness following the preferential etching can be substantially eliminated by a CMP process to achieve atomic scale finish, as well as to remove over etching to reduce pit depth, with FIG. 4C showing a cross section depiction following CMP.

Figure 4D:
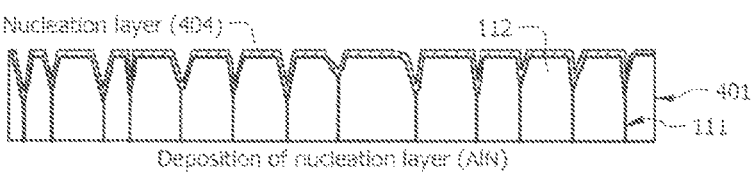
Figure 4E:
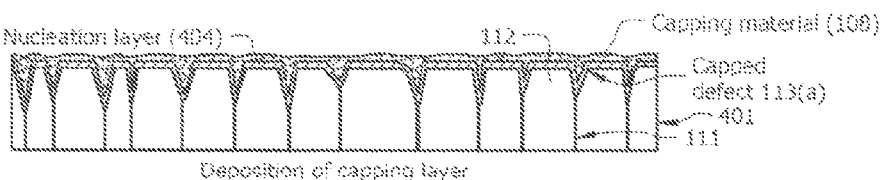
Figure 4F:
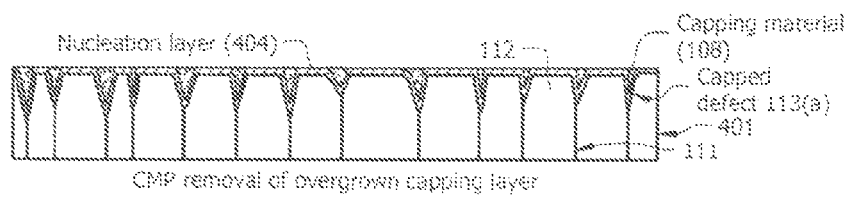

FIGS. 4D-4F show resulting cross section depictions following deposition of a nucleation layer 404 such as AlN, followed by deposition of a capping layer 108, and then CMP removal of the overburden capping layer, respectively. The nucleation layer 404, such as the AlN layer shown in FIG. 4D, can be grown using a variety of techniques, such as MBE or MOCVD.

Figure 4G:
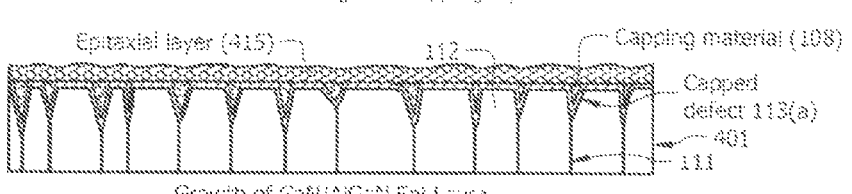

Epitaxial layer 415 comprising single crystal-like GaN or AlGaN films can then be grown using a variety of techniques with the resulting cross section depiction shown in FIG. 4G, such as by MBE, HYPE, MOCVD, or any growth technique or combination of techniques for epitaxial film formation over the underlying layer. These two techniques provide a wide range of abilities that are currently being used by industry to produce device quality material for the compound semiconductor industry. The thickness of the epitaxial GaN or AlGaN film can be approximately 2 to 4 μm.

Figure 4H:
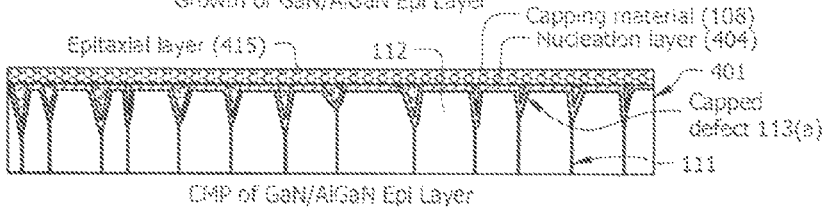

As described above, the epitaxial layer 415 can be polished (e.g., CMP) to reduce surface roughness with the resulting cross section depiction of the article shown in FIG. 4H. This process will ensure that the grown epitaxial GaN or AlGaN layer 415 will have an atomically smooth surface finish.

The use of different slurry chemistries to produce scratch-free GaN surfaces with formation of atomic terraces can be used. By increasing the surface reaction with specific chemistries has been found by the inventors to enhance the formation of terraces. In principle, chemistries which increase chemical reactivity will also enhance the ability to form terraced structures on the surface. Similarly, the process can be used for any hetero-epitaxy of crystalline materials in particular to semiconductor and compound semiconductor materials and their alloys example Si on Ge, Ge on Si, SiGe on Si, GaN on SiC, AlGaN on GaN, GaN on AlN, InN on GaN, InGaAlN on GaN and alloys thereof.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A method for forming an epitaxial layer on a substrate comprising a substrate surface having crystalline defect or amorphous regions and crystalline non-defect regions, comprising:
    preferential polishing said crystalline defect or amorphous regions relative to said crystalline non-defect regions using chemical mechanical polishing (CMP) to form a decorated substrate surface comprising surface recess regions;
    depositing a capping layer on said decorated substrate surface to cover said crystalline non-defect regions and to at least partially fill said surface recess regions;
    patterning said capping layer by removing said capping layer over said crystalline non-defect regions to form exposed non-defect regions while retaining said capping layer in at least a portion of said surface recess regions, and
    selective epitaxy to form said epitaxial layer, wherein said capping layer in said surface recess regions restricts epitaxial growth of said epitaxial layer over said surface recess regions.

2. The method of claim 1, further comprising chemical mechanical polishing (CMP) after said selective epitaxy to a top surface of said epitaxial layer to provide atomic level smoothness.

3. The method of claim 1, further comprising chemical mechanical polishing (CMP) said decorated substrate surface to provide an atomic scale finish before said depositing.

4. The method of claim 1, wherein said depositing comprises a blanket deposition, and said capping layer provides a masking function for restricting said epitaxial growth of said epitaxial layer over said surface recess regions.

5. The method of claim 4, wherein said depositing comprises physical, chemical or vapor deposition, or electrochemical or electroless deposition.

6. The method of claim 1, wherein said patterning comprises chemical mechanical polishing (CMP).

7. The method of claim 1, wherein said epitaxial layer is a homoepitaxial layer.

8. The method of claim 1 wherein said epitaxial layer is a heteroepitaxial layer.

9. The method of claim 1, wherein said substrate comprises silicon having a 10 Angstrom to 1 mm thick first Group III-nitride semiconductor layer thereon and said epitaxial layer comprises a second Group III-nitride semiconductor layer.

10. The method of claim 1, wherein said substrate surface comprises SiC or AlN.

11. The method of claim 1, wherein an average crystalline defect density throughout said epitaxial layer is $\leq 10^8$ cm$^{-2}$.

12. The method of claim 1, wherein said epitaxial layer comprises a group IV, II-VI, III-V material, or a binary ternary or quaternary alloy of said group II-VI material or said III-V material.

13. The method of claim 1, wherein a surface of said epitaxial layer has an atomic scale finish with a surface roughness less than 5 Å.

14. The method of claim 1, wherein said CMP comprises using a slurry including a mixture of chemicals and particles.

* * * * *